(12) United States Patent
Huang et al.

(10) Patent No.: US 9,557,649 B2
(45) Date of Patent: Jan. 31, 2017

(54) ASSIST FEATURE FOR A PHOTOLITHOGRAPHIC PROCESS

(71) Applicant: Taiwan Semiconductor Manufacturing Company, Ltd., Hsin-Chu (TW)

(72) Inventors: Tao-Min Huang, Taoyuan County (TW); Chia-Jen Chen, Hsinchu County (TW); Hsin-Chang Lee, Hsinchu County (TW); Chih-Tsung Shih, Hsinchu (TW); Shinn-Sheng Yu, Hsinchu (TW); Jeng-Horng Chen, Hsin-Chu (TW); Anthony Yen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/069,244

(22) Filed: Mar. 14, 2016

(65) Prior Publication Data
US 2016/0195812 A1      Jul. 7, 2016

Related U.S. Application Data

(62) Division of application No. 14/327,834, filed on Jul. 10, 2014, now Pat. No. 9,285,673.

(51) Int. Cl.
*G03F 7/20* (2006.01)
*G03F 1/24* (2012.01)
*G03F 1/36* (2012.01)
*G03F 1/38* (2012.01)

(52) U.S. Cl.
CPC ............... *G03F 7/2004* (2013.01); *G03F 1/24* (2013.01); *G03F 1/36* (2013.01); *G03F 1/38* (2013.01); *G03F 7/20* (2013.01); *G03F 7/7055* (2013.01)

(58) Field of Classification Search
CPC ............... G03F 1/24; G03F 1/36; G03F 1/38; G03F 7/20; G03F 7/2004; G03F 7/7055
USPC ....................................................... 430/5, 30
See application file for complete search history.

(56) References Cited

U.S. PATENT DOCUMENTS

| 8,628,897 B1 | 1/2014 | Lu et al. |
| 2014/0272681 A1 | 9/2014 | Huang et al. |
| 2016/0011501 A1 | 1/2016 | Huang et al. |

*Primary Examiner* — Christopher Young
(74) *Attorney, Agent, or Firm* — Haynes and Boone, LLP

(57) ABSTRACT

A photolithographic technique includes receiving a mask having a printing feature region, a sub-resolution assist feature (SRAF) region, and a third region. Each region has a different thickness of an absorptive layer disposed therein. The technique also includes exposing the mask to radiation, such that an intensity of radiation reflected by the SRAF region is substantially between an intensity of radiation reflected by the printing feature region and an intensity of radiation reflected by the third region. Using the radiation reflected by the printing feature region, the radiation reflected by the SRAF region, and the radiation reflected by the third region a workpiece is exposed.

20 Claims, 16 Drawing Sheets

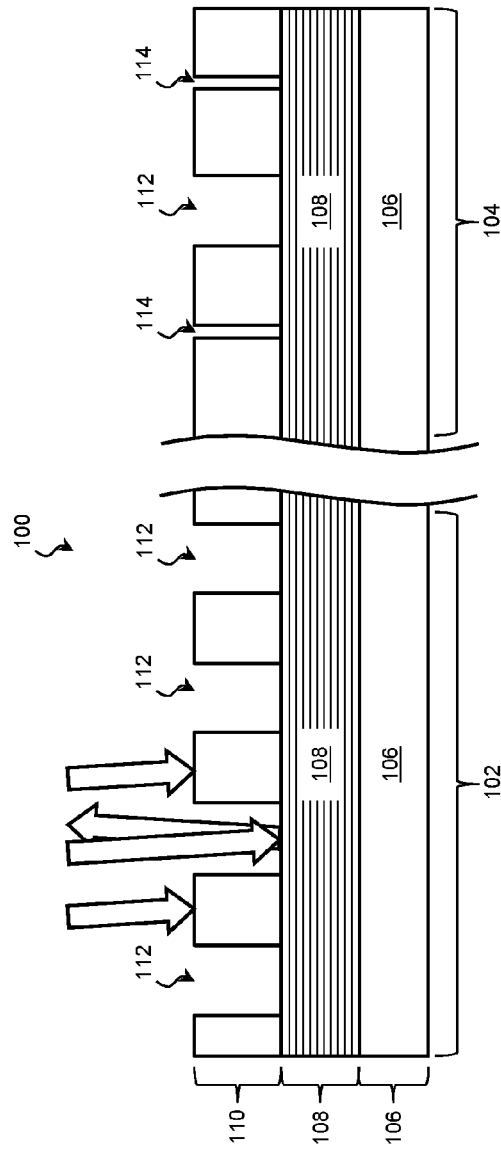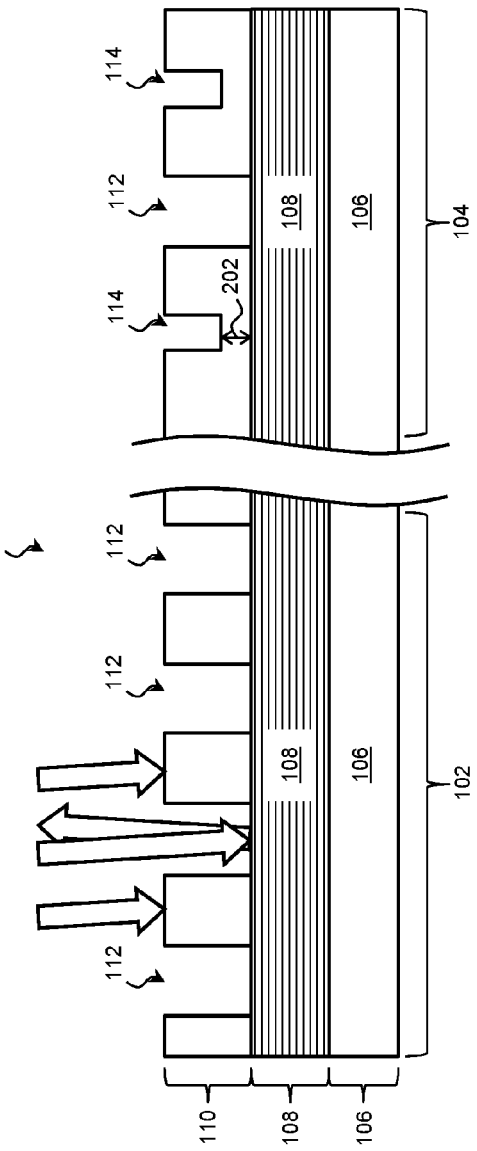

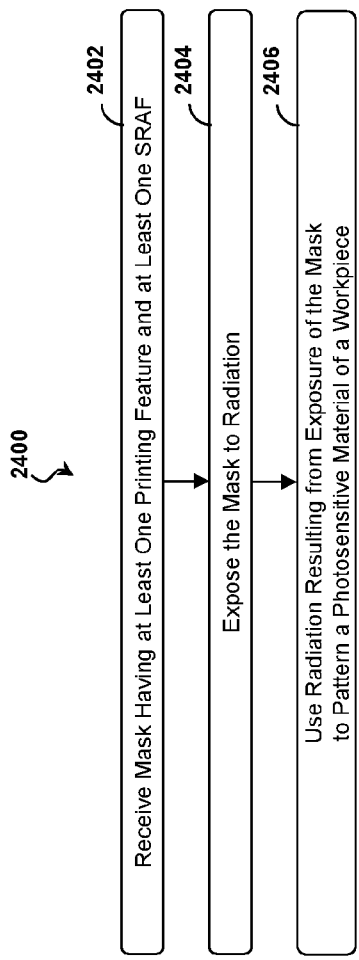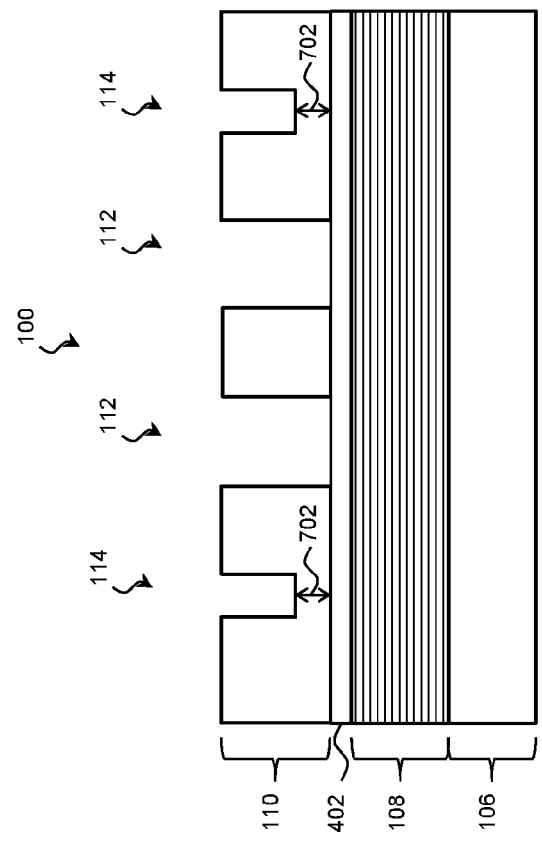

ASSIST FEATURE FOR A PHOTOLITHOGRAPHIC PROCESS

BACKGROUND

This patent is a divisional of U.S. Ser. No. 14/327,834 filed Jul. 10, 2014, the entire disclosure of which is hereby incorporated by reference.

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs, and, for these advances to be realized, similar developments in IC manufacturing are needed.

For example, traditional transmissive photolithography is being supplemented or replaced with reflective photolithography. ICs are typically assembled by layering features on a semiconductor substrate using a set of photolithographic masks. Transmissive masks have patterns formed by transmissive regions. During photolithographic exposure, radiation, such as ultraviolet light, passes through the transmissive regions of the mask before striking a photoresist coating on the substrate. The mask transfers the pattern onto the photoresist. In contrast, a reflective mask includes reflective and non-reflective regions. During exposure, the light reflected off the mask is used to form the pattern on the substrate. After either type of exposure, the photoresist is selectively removed to reveal the pattern. The substrate then undergoes processing steps that take advantage of the shape of the remaining photoresist to create circuit features on the substrate. When the processing steps are complete, photoresist is reapplied and substrate is exposed using the next mask. In this way, features are layered to produce the final circuit.

Reflective masks are advantageous in many applications because they can be used in conjunction with relatively higher frequency radiation such as extreme ultraviolet (EUV) radiation. EUV radiation forms more precise patterns and smaller features than conventional UV radiation, but has proven challenging to use in lithography. For example, most mask materials block EUV radiation, making it difficult to manufacture a suitable transmissive mask. In contrast, reflective masks are more easily manufactured and tuned for EUV environments. For this reason and others, reflective masks and reflective lithography have delivered positive results but present challenges as well.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 is a cross-sectional diagram of a reflective mask according to various aspects of the present disclosure.

FIG. 2 is a cross-sectional diagram of a reflective mask with a partial-thickness sub-resolution assist feature according to various aspects of the present disclosure.

FIG. 24 is a flow diagram of a photolithographic technique according to various aspects of the present disclosure.

FIG. 25 is a cross-sectional diagram of a portion of a mask used in a photolithographic technique according to various aspects of the present disclosure.

DETAILED DESCRIPTION

Figure 3:
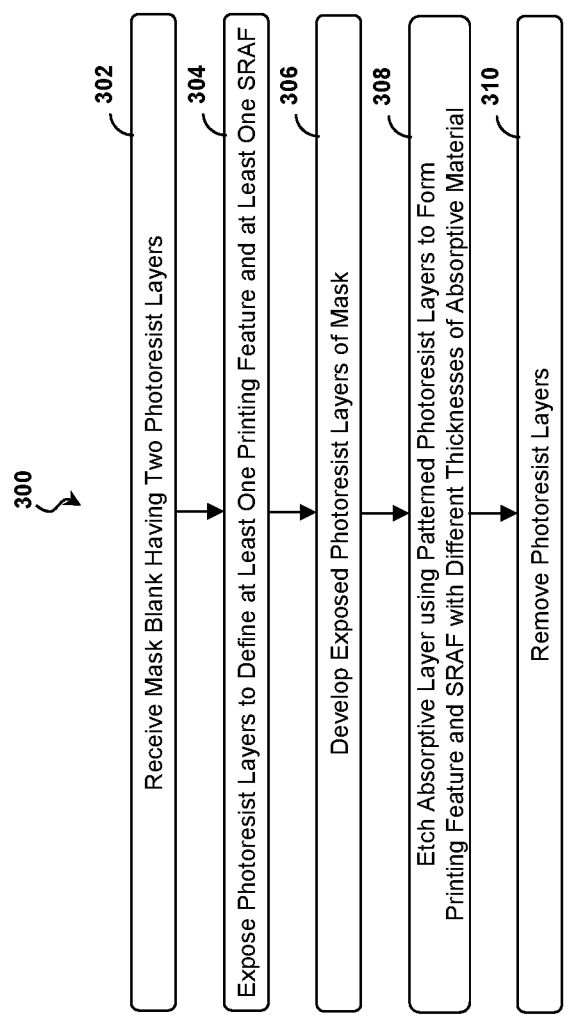
FIG. 3 is a flow diagram of a method of manufacturing a reflective mask having a partial thickness sub-resolution feature according to various aspects of the present disclosure.

The present disclosure relates generally to reflective masks for IC device manufacturing and, more particularly, to a reflective mask with an improved assist feature or scattering bar.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations), and the spatially relative descriptors used herein may likewise be interpreted accordingly.

FIG. 1 is a cross-sectional diagram of a reflective mask 100 having a dense region 102 and a sparse region 104 according to various aspects of the present disclosure. In the illustrated embodiment, the reflective mask 100 includes a substrate 106 with a reflector such as a multi-layer mirror (MLM) 108 disposed on the substrate 106. In turn, an absorptive layer 110 is disposed on the MLM 108. The composition of the substrate 106, the MLM 108, and the absorptive layer 110 are described in detail below. However, at a high level, regions of the mask 100 where the absorptive layer 110 is present absorb incident radiation, whereas regions of the mask 100 where the absorptive layer 110 is not present reflect incident radiation towards a target. In the illustrated embodiment, which is characteristic of a mask 100 for exposing a positive photoresist, the absorptive layer 110 is removed from regions that directly form features on the target (printing features 112) and removed from sub-resolution assist feature (SRAF) 114 regions, the purpose of which is described in more detail below. In this way, the pattern formed in the absorptive layer 110 may be transferred to the target.

As described above, the reflective mask 100 includes a dense region 102 and a sparse region 104. The dense region 102 is configured to produce features on a target spaced at a minimum printable distance apart. This minimum printable interval is often referred to as the critical dimension or "CD", and the CD distance (sometimes expressed as a pitch) is determined by properties of the lithographic process (e.g., exposure wavelength), properties of the target (e.g., photoresist stability), as well as other factors. In that regard, the lithographic process may be tuned for a particular CD value. In many embodiments, features spaced one CD interval apart are sharper with fewer undesirable optical effects such as corner rounding and edge placement errors than isolated features, because at this spacing, interference patterns produced by adjacent features constructively interfere to increase the contrast between features. In more detail, light passing through parallel openings in a mask produces bands of high and low intensity caused by interference. Closely spaced mask features constructively interfere to produce a more focused dose of radiation on the target.

In contrast, the sparse region 104 is configured to produce features on the substrate spaced farther apart than the CD interval. At such spacing, beneficial interference between features may be reduced or non-existent, leading to a lack of lithographic fidelity. To remedy this, sub-resolution assist features (SRAFs) 114, such as scattering bars, may be added to the printing features 112. As the name implies, the SRAFs 114 do not reflect (or transmit) sufficient radiation to exceed an exposure threshold and thereby cause a photoresist layer on the target to transition from one state to another. However, the SRAFs 114 improve the quality of nearby printing features 112 by leveraging properties including, but not limited to, diffraction interference. It is contemplated that SRAFs 114 may be used to correct any observed or suspected error as well as to generally improve any circuit characteristic such as minimum feature size, minimum pitch, minimum spacing, and yield.

Typically, the amount of reflected radiation produced by the SRAF 114 is controlled by the width (measured substantially perpendicular to the light path and parallel to an interface between the absorptive layer 110 and the MLM 108) of the SRAF 114 feature on the photomask 100. Thus, in the illustrated embodiment, the width of the SRAF 114 is significantly less than a width of a printing feature 112. However, as the size of features on the mask 100 are reduced, the narrower SRAFs 114 may be the first to exhibit defects. In the illustrated mask 100 for a positive resist, the SRAF 114 is a trench in the absorptive layer 110 that allows radiation to reach the MLM 108. An SRAF trench may experience line-width roughness (unintended variations in width), fill-in particle defects, and other defects and imperfection before such effects are seen in the trenches of the printing features 112. Similarly, in an embodiment in which the mask 100 is for a negative resist, an SRAF 114 may be a portion of the absorptive layer 110 that prevents radiation from reaching the MLM 108. In some such embodiments, an SRAF 114 may experience line-width roughness, absorptive layer collapse, and other defects before the portion of the absorptive layer 110 corresponding to the printing feature 112.

To overcome these challenges and others associated with narrow SRAF 114 shapes, in some embodiments, wider SRAFs 114 are formed that extend only partially through the absorptive layer 110. Referring to FIG. 2, a cross-sectional diagram of a reflective mask 100 with a partial-thickness sub-resolution assist feature is shown according to various aspects of the present disclosure. Similar to the embodiment of FIG. 1, the mask 100 has a sparse region 102 and a dense region 104 that may each include a number of printing features 112 and a number of SRAFs 114. In contrast to the above embodiments, the absorptive layer 110 is only partially removed in the SRAFs 114. In this way, some of the radiation incident to the SRAF 114 passes through the absorptive layer 110 and is reflected by the MLM 108 towards the target. Whereas in the preceding examples the amount of radiation reflected by an SRAF 114 is controlled by the width of the SRAF 114 feature, in the following examples, the amount of radiation reflected by an SRAF 114 is controlled by the thickness (indicated by arrow 202) of the absorptive layer 110 within the SRAF 114 region. The thickness 202 is measured perpendicular to the interface between the absorptive layer 110 and an MLM 108 and represents the amount of the absorptive layer 110 that the radiation passes through on a path to and from the MLM 108. The thickness 202 of the remaining absorptive layer 110 is selected such that the radiation reflected by the SRAF 114 does not exceed the exposure threshold for a photoresist material disposed on the target.

A technique for forming a reflective mask having a partial partial-thickness sub-resolution feature is described with reference to FIGS. 3-9. FIG. 3 is a flow diagram of a method 300 of manufacturing a reflective mask 100 having a partial thickness sub-resolution feature according to various aspects of the present disclosure. It is understood that additional steps can be provided before, during, and after the method 300, and some of the steps described can be replaced or eliminated for other embodiments of the method 300. FIGS. 4-9 are cross-sectional diagrams of a mask undergoing the manufacturing method 300 according to various aspects of the present disclosure.

Figure 4:
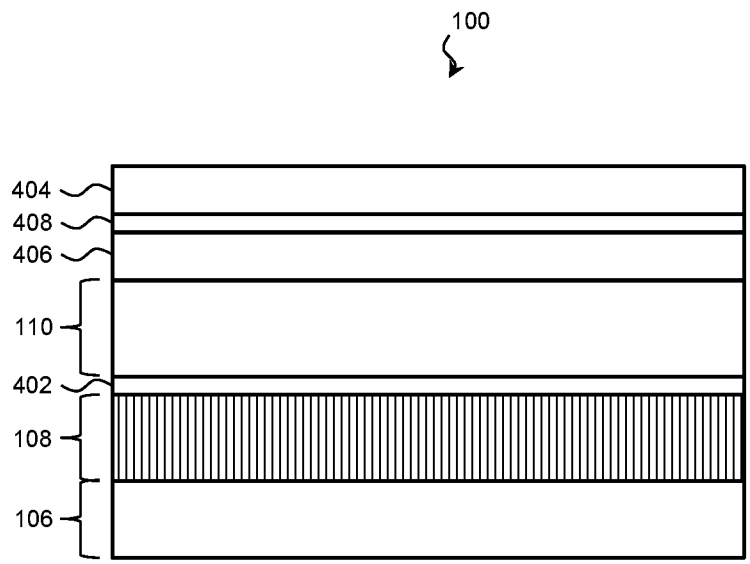
FIGS. 4-9 are cross-sectional diagrams of a mask undergoing a manufacturing method according to various aspects of the present disclosure.

Referring first to block 302 of FIG. 3 and to FIG. 4, a mask 100 is received. At this stage, because the mask 100 has not undergone a patterning process, the mask 100 may be referred to as a mask blank. The mask 100 includes a mask substrate 106, a reflector such as a multi-layer mirror (MLM) 108 disposed on the mask substrate 106, and an absorptive layer 110 disposed on the MLM 108. Turning first to the mask substrate 106, the substrate 106 commonly includes a low thermal expansion material (LTEM). Exemplary low thermal expansion materials include quartz as well as LTEM glass, silicon, silicon carbide, silicon oxide, titanium oxide, Black Diamond® (a trademark of Applied Materials), and/or other low thermal expansion substances known in the art. To support the photomask substrate 106, a chucking layer such as an electrostatic chucking layer or a mechanical chuck may be attached to the back side of the photomask substrate 106. Exemplary electrostatic chucking layer materials include chromium nitride, chromium oxynitride, chromium, TaBN, and TaSi.

The MLM 108 is disposed over the front side of the photomask substrate 106. The MLM 108 is a typical example of a reflective structure that is well-suited to EUV radiation. Rather than a single reflective surface, an MLM comprises a number of alternating material layers. Typical numbers of alternating pairs range from 20 to 80, although the MLM 108 may include any number of pairs. The number of layers, the layer thickness, and the layers materials are selected to provide the desired reflectivity based on the exposure radiation and its properties such as wavelength and/or angle of incidence. For example, layer thickness may be tailored to achieve maximum constructive interference of EUV radiation reflected at each interface of the film pairs while achieving a minimum absorption of extreme ultraviolet radiation by the MLM 108. Likewise, the materials used for each alternating pair may be selected based on their refractive index. In an exemplary embodiment, the MLM 108 includes forty pairs of alternating molybdenum and silicon (Mo—Si) layers. In a further exemplary embodiment, the MLM 108 includes sixty pairs of alternating molybdenum and beryllium (Mo—Be) layers.

A capping layer 402 (also known as a buffer layer) may be disposed over the MLM 108. In an embodiment, the capping layer 402 protects the MLM 108 during an etching and/or repair process. The capping layer 402 may include materials such as Ru, silicon dioxide, and/or amorphous carbon.

The absorptive layer 110 is disposed on the capping layer 402 and may comprise Cr, TaN, TaO, TaBN, TiN, combinations thereof, and/or other suitable absorptive materials. In some embodiments, the absorptive layer 110 contains multiple layers of absorptive material, for example, layers of chromium and layers of tantalum nitride. The absorptive layer 110 may also include an anti-reflective coating (ARC). Suitable ARC materials include TaBO, $Cr_2O_3$, $SiO_2$, SiN, $TaO_5$, TaON, and/or other suitable materials.

The MLM 108, the capping layer 402, and the absorptive layer 110 may be disposed on the substrate 106 by various methods, including physical vapor deposition (PVD) processes such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, and/or other methods known in the art. In an embodiment, the absorptive layer 110 is deposited by a sputtering deposition technique to achieve a controlled thickness and uniformity with relatively low defects and good adhesion. The compositions and/or physical structures of one or more layers described above may be selected based upon reflectivity/absorption of the radiation to be used with the mask 100, the stress compatibility with adjacent layers, and/or other criteria known in the art.

In the illustrated embodiment, two layers of a photoresist material (i.e., upper layer 404 and lower layer 406) are disposed on the absorptive layer 110. An exemplary photoresist includes a photosensitive material that causes the layer to undergo a property change when exposed to radiation exceeding an exposure threshold. This property change can be used to selectively remove exposed or unexposed portions of the photoresist layer in a process referred to as lithographic patterning. As described below, the photoresist layers 404 and 406 may be patterned in a direct write or maskless lithographic technique and may include laser-sensitive, e-beam sensitive, and/or ion beam-sensitive materials. Because the upper photoresist layer 404 may block some of the exposure radiation from reaching the lower photoresist layer 406, the lower photoresist layer 406 may be configured to have a lower exposure threshold and to be more sensitive to radiation than the upper photoresist layer 404. The photoresist layers 404 and 406 may be formed by any suitable technique including spin-on coating. In some embodiments, a barrier layer 408 is formed between the lower photoresist layer 406 and the upper photoresist layer 404 to prevent mixing of the photosensitive materials.

Figure 5:
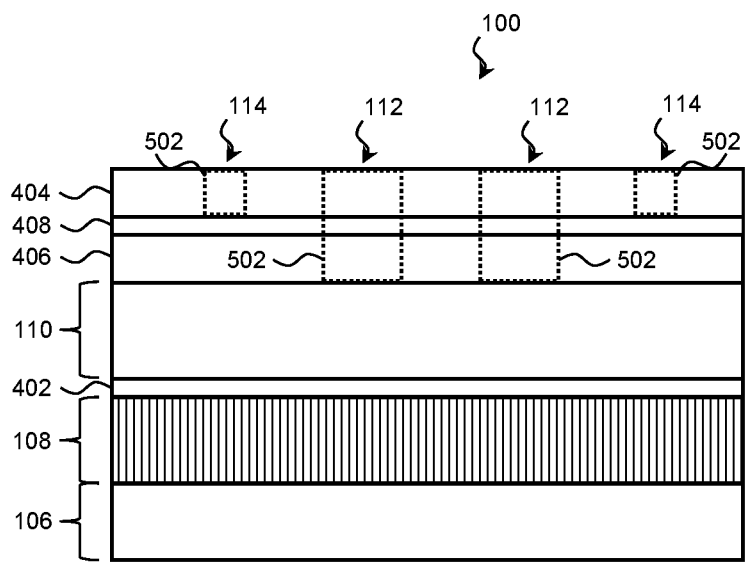
Figure 6:
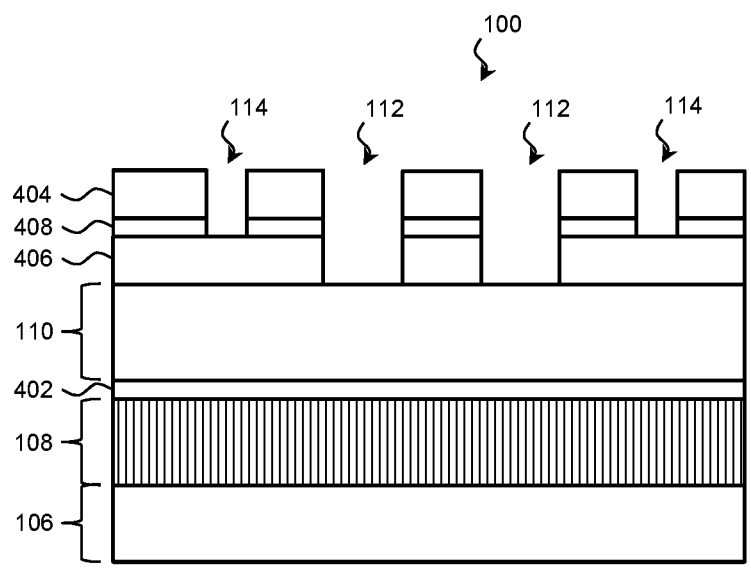

Referring to block 304 of FIG. 3 and to FIG. 5, the mask 100 is patterned to define at least one printing feature 112 and at least one SRAF 114. In many embodiments, the mask 100 is patterned using a direct write or other maskless lithographic technique. In some such embodiments, a narrow-focus radiation source such as a laser, e-beam, or ion beam is scanned across the upper surface of the mask 100. The radiation source is controlled to expose only those areas of the photoresist layers 404 and 406 to be removed or, in alternate embodiments, to expose only those areas of the photoresist layers 404 and 406 intended to remain. In the example of FIG. 5, areas of the photoresist layers 404 and 406 that receive a radiation dose greater than the exposure threshold are represented by dashed boxes 502. In the example, only the upper photoresist layer 404 is exposed to define the SRAF 114, while both the upper photoresist layer 404 and the lower photoresist layer 406 are exposed to define the printing feature 112.

In many embodiments, this can be achieved in a single pass of the radiation source. For example, in an embodiment, a variable intensity radiation source is used to scan the surface of the mask 100. In areas corresponding to an SRAF 114, the radiation intensity is selected to exceed the exposure threshold of the upper photoresist layer 404 while remaining low enough that the radiation penetrating the upper photoresist layer 404 does not exceed the exposure threshold of the lower photoresist layer 406. In areas corresponding to a printing feature 112, the radiation intensity is selected to exceed the exposure thresholds of both the upper photoresist layer 404 and the lower photoresist layer.

In another exemplary embodiment, a width-dependent patterning technique leverages the principle that, for some techniques, exposing a larger area (such as the area defining the printing feature 112) will result in a higher average dose throughout the exposed area than exposing a narrower area (such as the area defining the SRAF 114). Accordingly, even if the exposure intensity of the radiation source does not change, the radiation dose may be different for the printing feature 112 region and the SRAF 114 region. In such an embodiment, the lower photoresist layer 406 is configured to have an exposure threshold that is less than the dose received within the printing feature 112 region but more than the dose received within SRAF 114 region. Other suitable techniques for patterning the mask 100 to define the printing feature 112 and the SRAF 114 are both contemplated and provided for and, in various other embodiments, other single pass and multi-pass lithographic techniques are used to expose the photoresist layers 404 and 406. Referring to block 306 of FIG. 3 and to FIG. 6, the photoresist layers 404 and 406 are developed after exposure. An exemplary developing process includes post-exposure baking, developing the photoresist layers, rinsing, and drying (e.g., hard baking).

Figure 7:
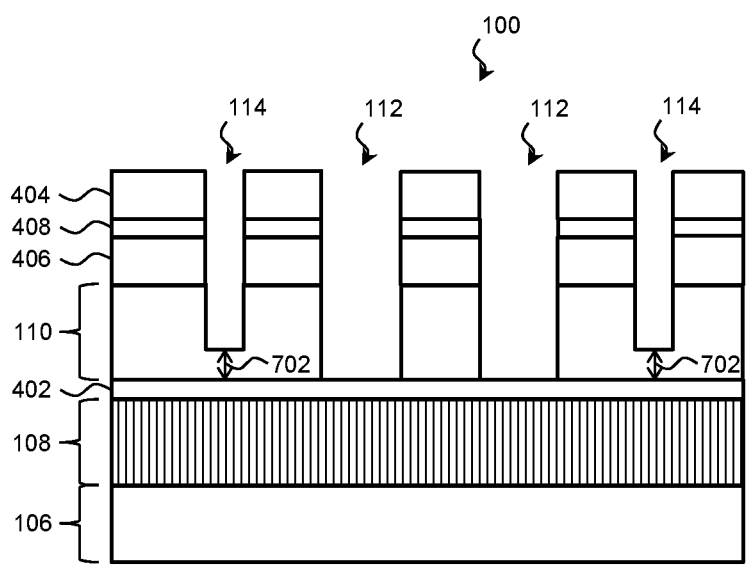
Figure 8:
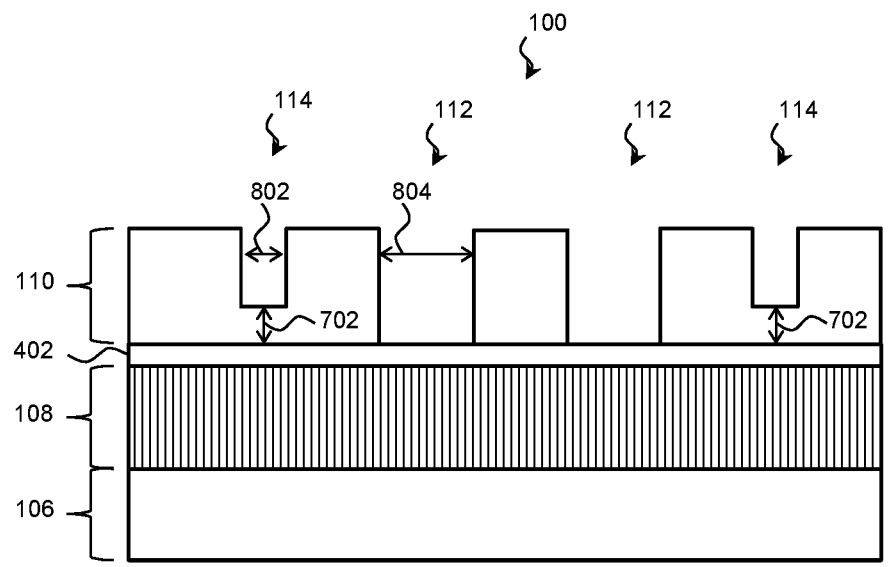

Referring to block 308 of FIG. 3 and to FIG. 7, the absorptive layer 110 is etched using the patterned photoresist layers 404 and 406. The etching may include any suitable etching process including dry etching, wet etching, and/or other etching methods (e.g., reactive ion etching (RIE)). For example, in an embodiment, the absorptive layer 110 is etched in a dry etching process using a fluorine-based etchant and/or a chlorine-based etchant. In some embodiments, etching includes multiple etching steps with different etching chemistries, each targeting a particular material of the absorptive layer 110. As can be seen, the lower photoresist layer 406 delays the etching of the absorptive layer 110 in the SRAF 114 region, while the etching of the absorptive layer 110 in the printing feature 112 region proceeds unhindered. In the illustrated embodiment, the etching is stopped after the absorptive layer 110 in the printing feature 112 region has been removed but before the absorptive layer 110 in the SRAF 114 region has been completely etched. Accordingly, after etching, the absorptive layer 110 has a different thickness 702 in the SRAF 114 region than in the printing feature 112 region in the surrounding regions. The thickness 702 of the remaining absorptive layer 110 is selected such that the radiation reflected by the SRAF 114 does not exceed the exposure threshold for a photoresist material disposed on the target. In various exemplary embodiments, the unetched absorptive layer 110 has a thickness (measured perpendicular to the interface between the absorptive layer 110 and the MLM 108) of between about 90 nm and about 20 nm. In these examples, the thickness 702 of the absorptive layer 110 in the SRAF 114 region is selected to be less than the unetched thickness and greater than $\lambda/4$, where $\lambda$ is the wavelength of the radiation used in the associated photolithographic process. In one such example, the thickness 702 is about 3 nm.

In contrast, all or substantially all of the absorptive layer 100 may be removed from the printing feature 112. In the illustrated embodiment, little or none of the absorptive layer 110 is removed from the regions of the mask 100 that do not correspond to a printing feature 112 or an SRAF 114. Accordingly, the thickness of the absorptive layer 110 in these regions is different from the thicknesses of the printing feature 112 and the SRAF 114. Referring to block 310 of FIG. 3 and to FIG. 8, the photoresist layers 404 and 406 may be stripped after etching the absorptive layer 110.

Figure 9:
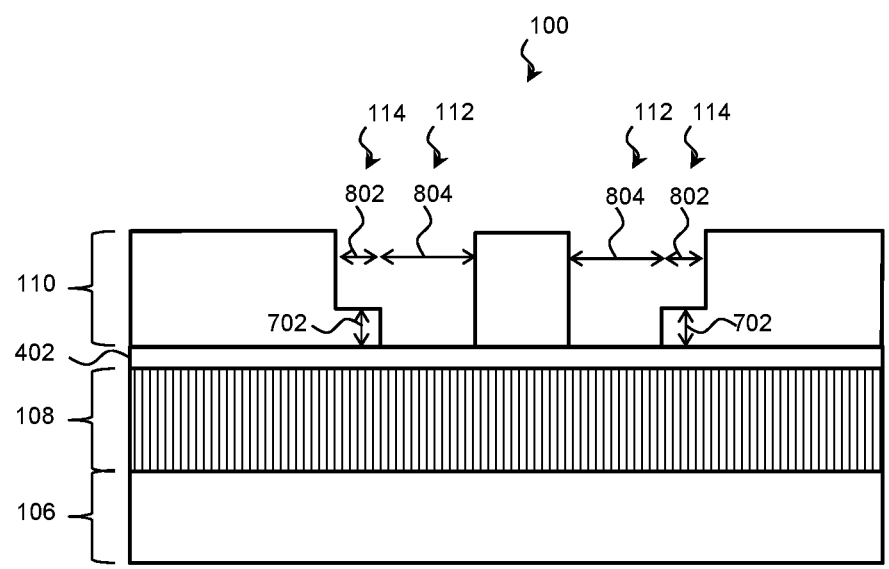

By using the thickness 702 of the absorptive layer 110 in the SRAF 114 region to control the amount of reflected radiation, the SRAF 114 may be made wider than a conventional assist feature, reducing the likelihood of defects. In an exemplary embodiment where the width 804 of the printing feature 112 is about 15.5 nm, the width 802 of the SRAF 114 is about 4 nm. It is understood that these dimensions are merely exemplary. The partial-thickness SRAFs 114 also allow for variations in the placement of the SRAFs 114 that are not possible in other configurations. Referring to FIG. 9, in some embodiments, one or more SRAFs 114 are located immediately adjacent to a printing feature 112 so that a single recess in the absorptive layer 110 defines both the printing feature 112 and the one or more SRAFs 114.

A technique for forming a reflective mask having a partial partial-thickness sub-resolution feature using a single photoresist layer is described with reference to FIGS. 10-16.

Figure 10:
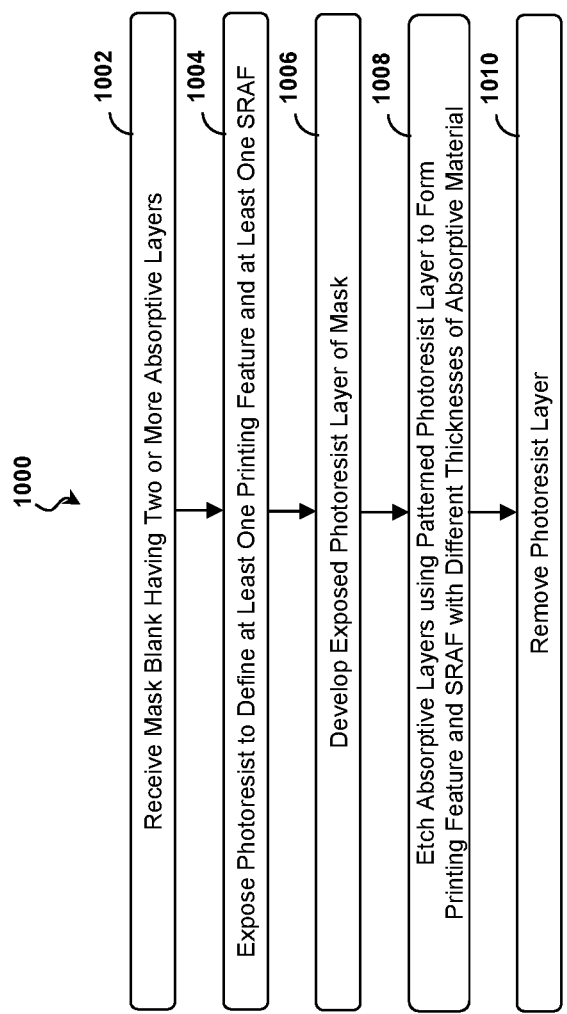
FIG. 10 is a flow diagram of a method of manufacturing a reflective mask with a partial thickness sub-resolution feature according to various aspects of the present disclosure.

FIG. 10 is a flow diagram of a method 1000 of manufacturing a reflective mask 100 with a partial thickness sub-resolution feature according to various aspects of the present disclosure. It is understood that additional steps can be provided before, during, and after the method 1000, and some of the steps described can be replaced or eliminated for other embodiments of the method 1000. FIGS. 11-16 are cross-sectional diagrams of a mask 100 undergoing the manufacturing method 1000 according to various aspects of the present disclosure.

Figure 11:
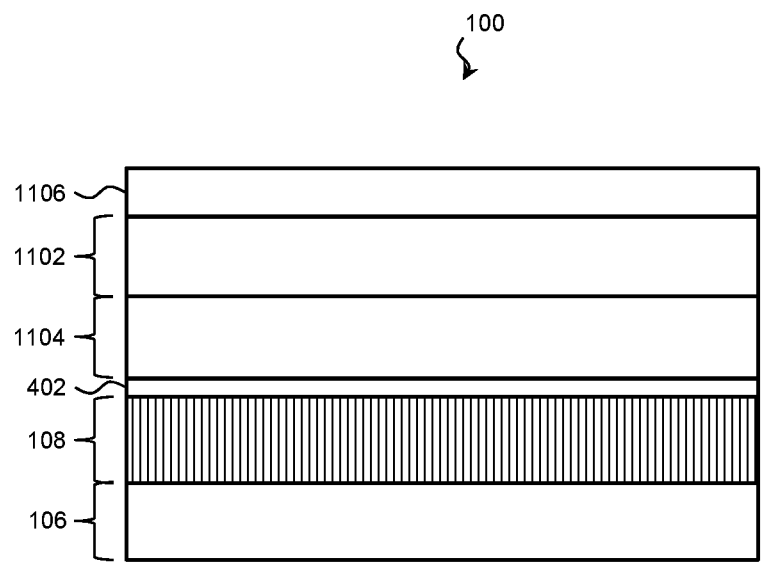
FIGS. 11-16 are cross-sectional diagrams of a mask undergoing a manufacturing method according to various aspects of the present disclosure.

Referring first to block 1002 of FIG. 10 and to FIG. 11, a mask 100 is received. The mask 100 may be substantially similar to the mask received in block 302 of FIG. 3, and in that regard may include a mask substrate 106, a reflector such as a multi-layer mirror (MLM) 108 disposed on the mask substrate 106, and a capping layer 402 disposed on the MLM 108. As the mask has not yet been patterned, in the illustrated embodiment, the mask 100 may be referred to as a mask blank.

In the embodiment of FIG. 11, the mask includes a upper absorptive layer 1102 and a lower absorptive layer 1104, each of which may contain multiple layers of absorptive material. The upper absorptive layer 1102 and the lower absorptive layer 1104 are selected to have different etch sensitivities. For example, fluorine-containing etchants tend to etch chromium and oxides such as TaO faster than nitrides such as SiN, TaBN, TaN, or TiN. In contrast, chlorine-containing etchants tend to etch nitrides such as SiN, TaBN, TaN, and TiN faster than chromium or oxides such as TaO. Accordingly, in an embodiment, the upper absorptive layer 1102 includes at least one of chromium and TaO, and the lower absorptive layer 1104 includes at least one of SiN, TaBN, TaN, and TiN. In a further embodiment, the upper absorptive layer 1102 includes at least one of SiN, TaBN, TaN, and TiN, and the lower absorptive layer 1104 includes at least one of chromium and TaO. It is understood that the relative thicknesses of the upper absorptive layer 1102 and the lower absorptive layer 1104 are merely exemplary and in other embodiments, one of the absorptive layers 1102 and 1104 is substantially thicker than the other. In some embodiments, the mask 100 includes an anti-reflective coating (ARC) disposed on the absorptive layers 1102 and 1104. Suitable ARC materials include TaBO, $Cr_2O_3$, $SiO_2$, SiN, $TaO_5$, TaON, and/or other suitable materials.

The mask 100 also includes a photoresist layer 1106 is disposed on the absorptive layers 1102 and 1104. As described below, the photoresist layer 1106 may be patterned in a direct write or maskless lithographic technique, and accordingly, may include laser-sensitive, e-beam sensitive, and/or ion beam-sensitive materials. The photoresist layer 1106 may be formed by any suitable technique including spin-on coating.

Figure 12:
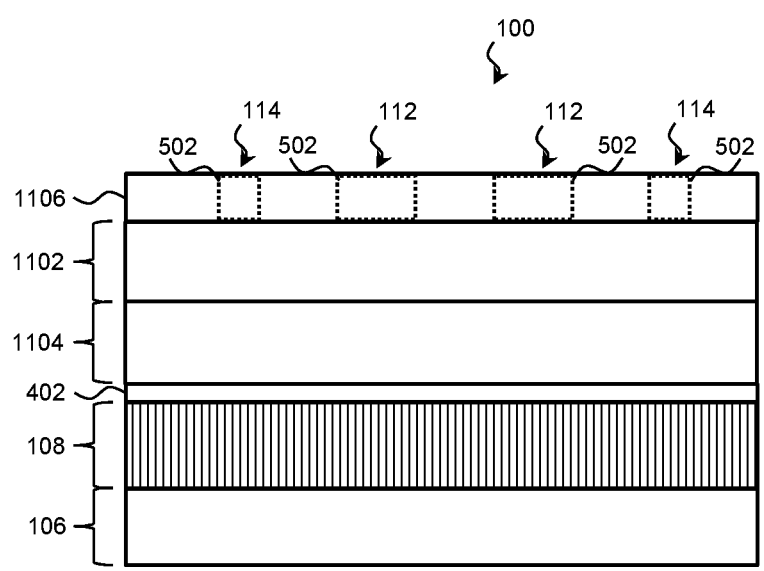
Figure 13:
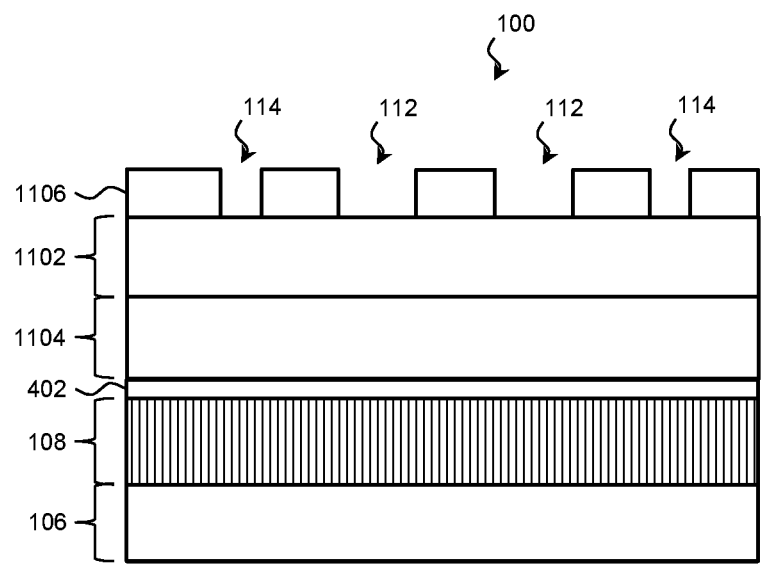

Referring to block 1004 of FIG. 10 and to FIG. 12, the mask 100 is patterned to define at least one printing feature 112 and at least one SRAF 114. In many embodiments, the mask 100 is patterned using a direct write or other maskless lithographic technique. In some such embodiments, a narrow-focus radiation source such as a laser, e-beam, or ion beam is scanned across the upper surface of the mask 100. The radiation source is controlled to expose only those areas of the photoresist layer 1106 to be removed or, in alternate embodiments, to expose only those areas of the photoresist layer 1106 intended to remain. In the example of FIG. 11, areas of the photoresist layer 1106 that receive a radiation dose greater than the exposure threshold are represented by dashed boxes 502. In contrast to the previous examples, only a single photoresist layer 1106 is exposed, and regions of the photoresist layer 1106 are exposed to define both the printing features 112 and the SRAFs 114. Referring to block 1006 of FIG. 10 and to FIG. 13, the photoresist layer 1106 is developed after exposure. An exemplary developing process includes post-exposure baking, developing the photoresist layers, rinsing, and drying (e.g., hard baking).

Figure 14:
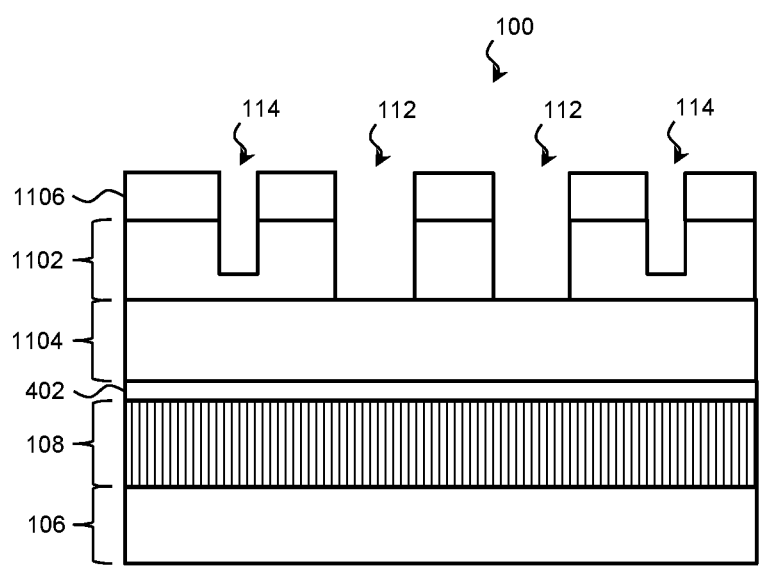
Figure 15:
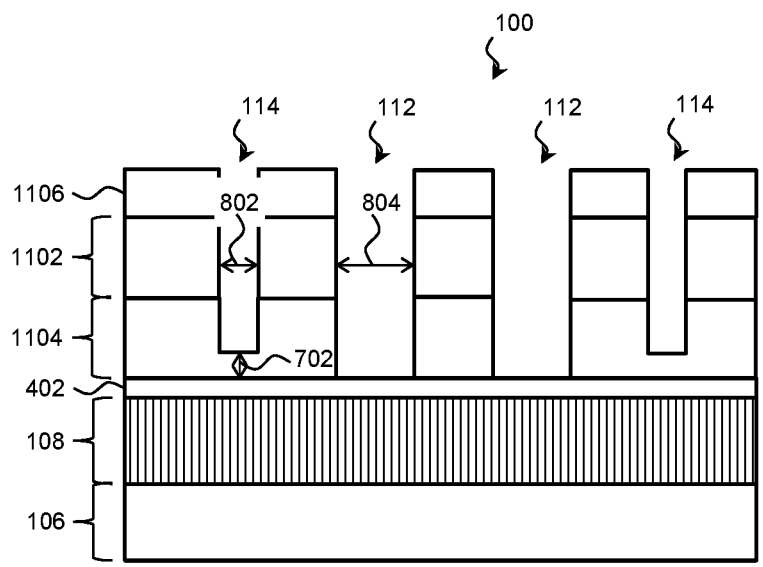
Figure 16:
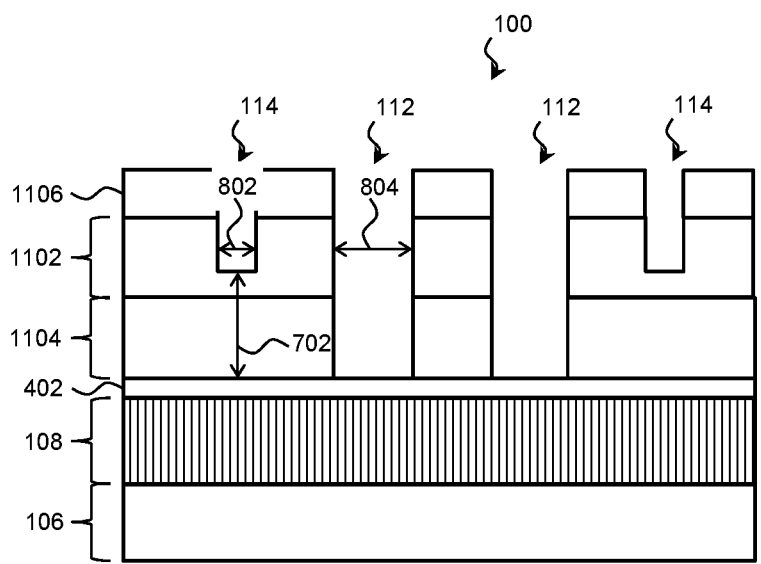

Referring to block 1008 of FIG. 10 and to FIGS. 14 and 15, the upper absorptive layer 1102 and the lower absorptive layer 1104 are etched using the patterned photoresist layer 1106. The etching may include any suitable etching process including dry etching, wet etching, and/or other etching methods (e.g., RIE). In order to etch to different depths, some embodiments take advantage of etchant selectivity and/or an etchant loading effect, the tendency of some etching processes to etch wider features faster than narrower features. In embodiments in which the SRAF 114 regions are narrower than the printing feature 112 regions, the SRAF 114 regions may etch at a slower rate than the printing feature 112 regions. In this way, a single etching process can be used to form printing features 112 and SRAFs 114 having different amounts of the absorptive layers 1102 and 1104 remaining. The relative etching rates of wide features and narrow features (i.e., the etchant loading effect) may be controlled by adjusting the thickness of the photoresist layer 1106, where a thicker photoresist layer 1106 enhances the etchant loading effect. Additionally or in the alternative, the etchant loading effect can be controlled by manipulating parameters of the etching process such as etchant chemicals, ambient pressure, RF power, and/or other etching parameters.

In the embodiments of FIGS. 14 and 15, the etching rate differences are amplified by changing the etching technique during the etching of block 1008. In one such embodiment, a first etchant is used to target the materials of the upper absorptive layer 1102 as shown in FIG. 14. Due to the etchant loading effect, the etching exposes the lower absorptive layer 1104 of the printing feature 112 before exposing the lower absorptive layer 1104 of the SRAF 114. Before the lower absorptive layer 1104 of the SRAF 114 is exposed, the etching technique is altered to target the lower absorptive layer 1104 as shown in FIG. 14. The altered technique may still etch the upper absorptive layer 1102 but at a slower rate. During the initial stages, because the lower absorptive layer 1104 of the SRAF 114 is still protected by the upper absorptive layer 1102, only the printing feature 112 is etched at the accelerated rate. In one example, a fluorine-based etchant is used to etch the upper absorptive layer 1102 in both the printing feature 112 region and the SRAF 114 region. As the lower absorptive layer 1104 is exposed in the printing feature region 112, some or all of the fluorine-based etchant is replaced by a chlorine-based etchant that targets the lower absorptive layer 1104. In a further example, a chlorine-based etchant is used to etch the upper absorptive layer 1102 in both the printing feature 112 region and the SRAF 114 region. As the lower absorptive layer 1104 is exposed in the printing feature region 112, some or all of the chlorine-based etchant is replaced by a fluorine-based etchant that targets the lower absorptive layer 1104. Of course, these etching techniques are merely exemplary and other selective etching techniques are contemplated and provided for.

In the illustrated embodiments of FIG. 15, the etching is stopped after the upper absorptive layer 1102 and the lower absorptive layer 1104 in the printing feature 112 region have been removed but before the lower absorptive layer 1104 in the SRAF 114 region has been completely etched. Accordingly, after etching, the absorptive layers 1102 and 1104 have a different thickness 702 in the SRAF 114 region than in the printing feature 112 region. In other embodiments, such as those of FIG. 16, the etching is stopped before the upper absorptive layer 1102 in the SRAF 114 region has been completely etched. In these embodiments as well, the absorptive layers 1102 and 1104 have a different thickness 702 in the SRAF 114 region than in the printing feature 112 region. In contrast, all or substantially all of the absorptive layers 1102 and 1104 may be removed from the printing feature 112. In the illustrated embodiment, little or none of the absorptive layers 1102 and 1104 is removed from the regions of the mask 100 that do not correspond to a printing feature or an SRAF 114. Accordingly, the thickness of the absorptive layers 1102 and 1104 in these regions is different from the thicknesses of the printing feature 112 and the SRAF 114. Referring to block 1010 of FIG. 10, the photoresist layer 1106 may be stripped after etching the absorptive layers 1102 and 1104.

Figure 17:
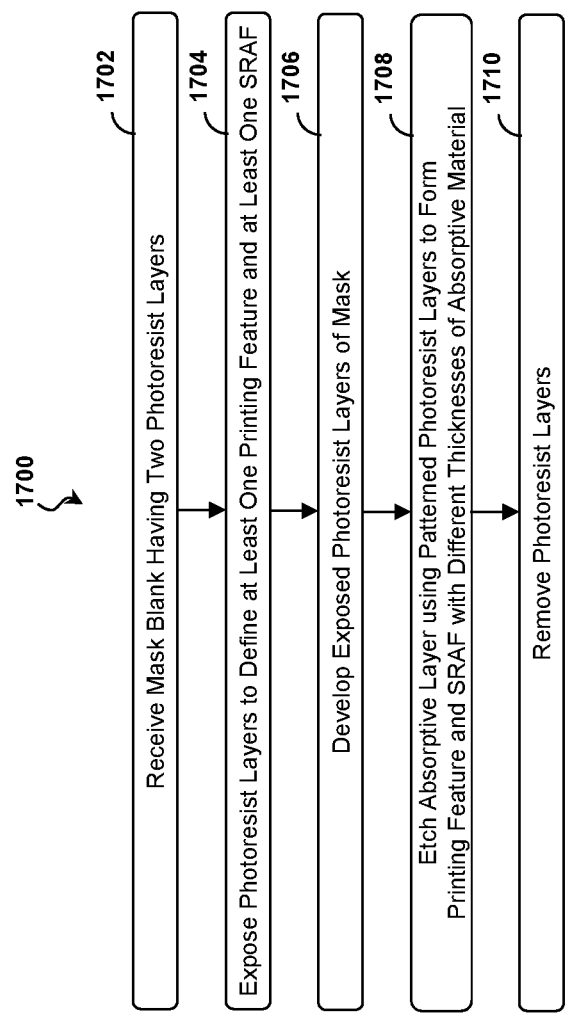
FIG. 17 is a flow diagram of a method of manufacturing a reflective mask for exposing a negative-type photoresist according to various aspects of the present disclosure.

A technique for forming a reflective mask 100 for exposing a negative photoresist is described with reference to FIGS. 17-23. FIG. 17 is a flow diagram of a method 1700 of manufacturing a reflective mask 100 for exposing a negative-type photoresist according to various aspects of the present disclosure. It is understood that additional steps can be provided before, during, and after the method 1700, and some of the steps described can be replaced or eliminated for other embodiments of the method 1700. FIGS. 18-23 are cross-sectional diagrams of a mask for exposing a negative-type photoresist undergoing the manufacturing method 1700 according to various aspects of the present disclosure.

Figure 18:
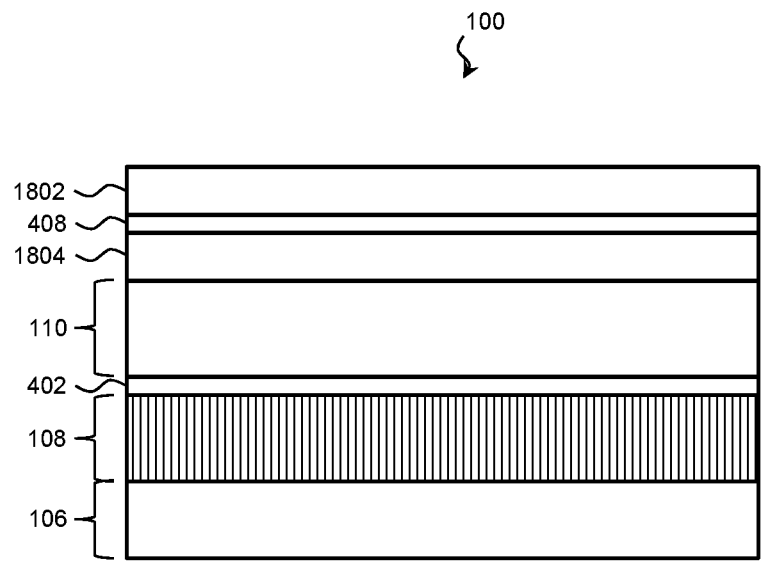
FIGS. 18-23 are cross-sectional diagrams of a mask for exposing a negative-type photoresist undergoing a manufacturing method according to various aspects of the present disclosure.

Referring first to block 1702 of FIG. 17 and to FIG. 18, a mask 100 is received. The mask 100 may be substantially similar to the mask received in block 302 of FIG. 3, and in that regard may include a mask substrate 106, a reflector such as a multi-layer mirror (MLM) 108 disposed on the mask substrate 106, a capping layer 402 disposed on the MLM 108, an absorptive layer 110 formed on the capping layer 402, and two photoresist layers (upper layer 1802 and lower layer 1804) formed on the absorptive layer 110. The photoresist layers 1802 and 1804 may be either positive type or negative type, and in the illustrated embodiment, the layers 1802 and 1804 are negative type (i.e., portions of the photoresist layers 1802 and 1804 exposed to radiation are hardened to withstand the developer). As described below, the photoresist layers 1802 and 1804 may be patterned in a direct write or maskless lithographic technique, and may include laser-sensitive, e-beam sensitive, and/or ion beam-sensitive materials. Because the upper photoresist layer 1802 may block some of the exposure radiation from reaching the lower photoresist layer 1804, the lower photoresist layer 1804 may be configured to have a lower exposure threshold and to be more sensitive to radiation than the upper photoresist layer 1802. The photoresist layers 1802 and 1804 may be formed by any suitable technique including spin-on coating. In some embodiments, a barrier layer 408 is formed between the lower photoresist layer 1804 and the upper photoresist layer 1802 to prevent mixing of the photosensitive materials.

Figure 19:
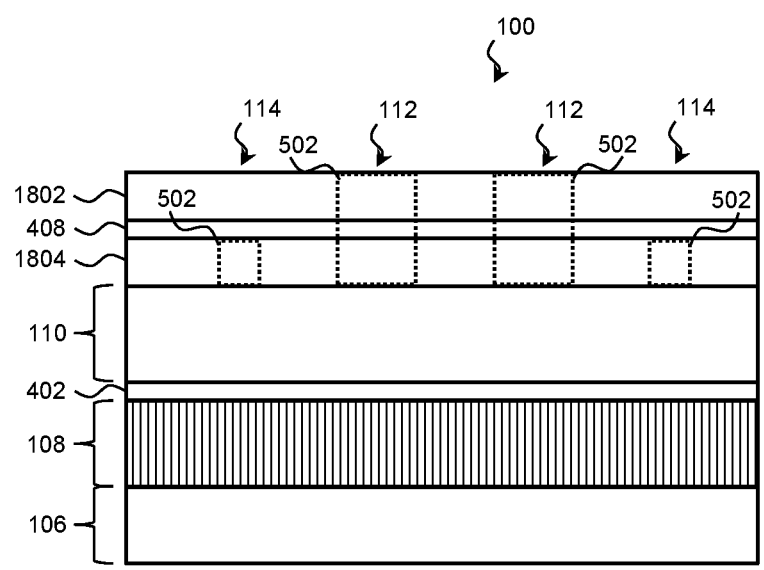
Figure 20:
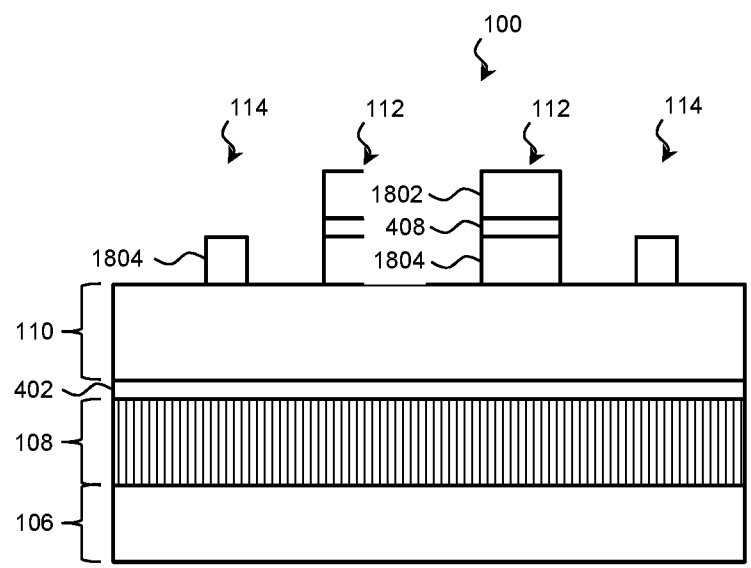

Referring to block 1704 of FIG. 17 and to FIG. 19, the mask 100 is patterned to define at least one printing feature 112 and at least one SRAF 114. In many embodiments, the mask 100 is patterned using a direct write or other maskless lithographic technique. In some such embodiments, a narrow-focus radiation source such as a laser, e-beam, or ion beam is scanned across the upper surface of the mask 100. The radiation source is controlled to expose only those areas of the photoresist layers 1802 and 1804 to be hardened or, in alternate embodiments, to expose only those areas to be removed. In the example of FIG. 19, areas of the photoresist layers 1802 and 1804 that receive a radiation dose greater than the exposure threshold are represented by dashed boxes 502. Due to the different exposure thresholds, only the lower photoresist layer 1804 is exposed enough to exceed the exposure threshold in the SRAF 114 region, while both the upper photoresist layer 1802 and the lower photoresist layer 1804 are exposed in the printing feature 112 region.

In many embodiments, this can be achieved in a single pass of the radiation source. For example, in an embodiment, a variable intensity radiation source is used to scan the surface of the mask 100. In the SRAF 114 region, a radiation intensity is selected that exceeds the exposure threshold of the lower photoresist layer 1804 but does not exceed the exposure threshold of the upper photoresist layer 1802.

In another exemplary embodiment, a width-dependent patterning technique leverages the principle that exposing a larger area (such as the area defining the printing feature 112) will cause a higher average dose throughout the exposed area than exposing a narrower area (such as the area defining the SRAF 114). Thus, even if the exposure intensity of the radiation source does not change, the radiation dose may be different for the printing feature 112 region and the SRAF 114 region. In such an embodiment, the upper photoresist layer 1802 is selected to have an exposure threshold that is less than the dose received by the printing feature 112 region but more than the dose received by SRAF 114 region. Other suitable techniques for patterning the mask to define the printing feature 112 and the SRAF are both contemplated and provided for and, in various other embodiments, other single pass and multi-pass lithographic techniques are used to expose the photoresist layers 1802 and 1804. Referring to block 1706 of FIG. 17 and to FIG. 20, the photoresist layers 1802 and 1804 are developed after exposure. An exemplary developing process includes post-exposure baking, developing the photoresist layers, rinsing, and drying (e.g., hard baking).

Figure 21:
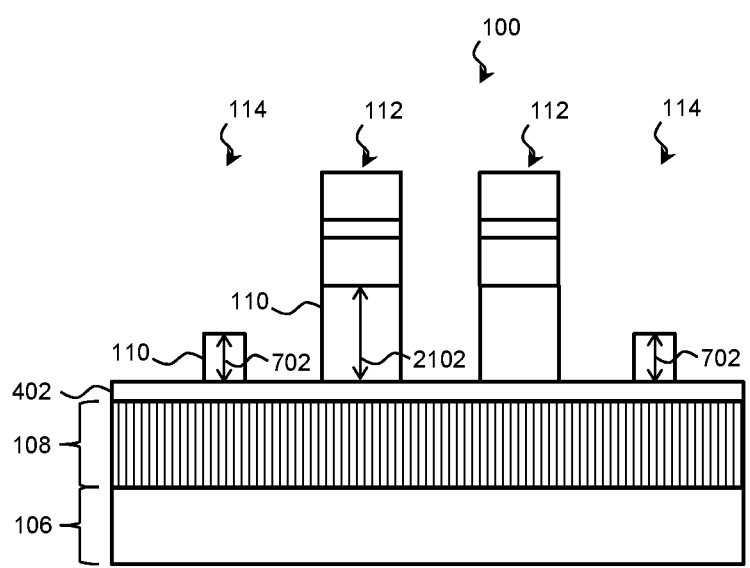
Figure 22:
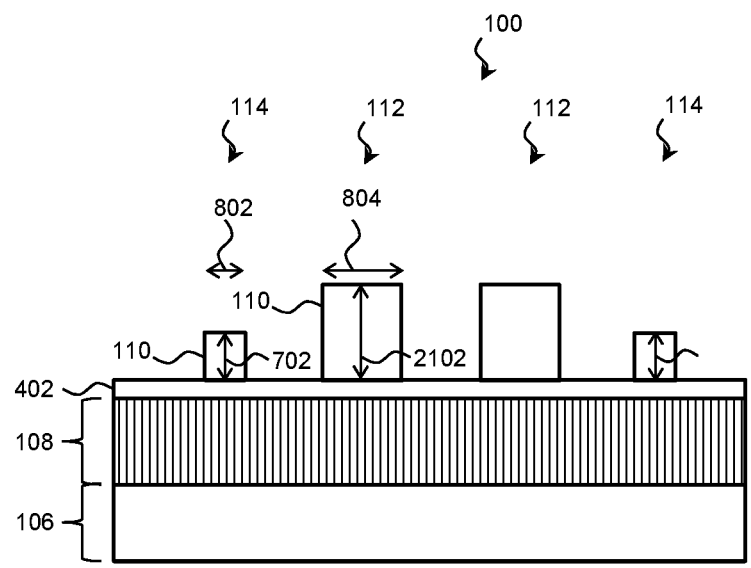

Referring to block 1708 of FIG. 17 and to FIG. 21, the absorptive layer 110 is etched using the patterned photoresist layers 1802 and 1804. The etching may include any suitable etching process including dry etching, wet etching, and/or other etching methods (e.g., RIE). In some embodiments, etching includes multiple etching steps with different etching chemistries, each targeting a particular material of the absorptive layer 110. As can be seen, the lower photoresist layer 1804 delays the etching of the absorptive layer 110 in the SRAF 114 region, while the absorptive layer 110 in the printing feature 112 region is protected by both the upper photoresist layer 1802 and the lower photoresist layer 406. In the illustrated embodiment, the etching is stopped before the absorptive layer 110 in the SRAF 114 region has been completely etched but after the absorptive layer 110 in the surrounding regions has been removed. As can be seen, after etching, the absorptive layer 110 has a different thickness (thickness 702) in the SRAF 114 region than in the printing feature 112 region (thickness 2102). The thickness 702 of the remaining absorptive layer 110 is selected such that the radiation reflected by the SRAF 114 does not exceed the exposure threshold for a photoresist material disposed on the target. Referring to block 1710 of FIG. 17 and to FIG. 22, the photoresist layers 1802 and 1804 may be stripped after etching the absorptive layer 110.

Figure 23:
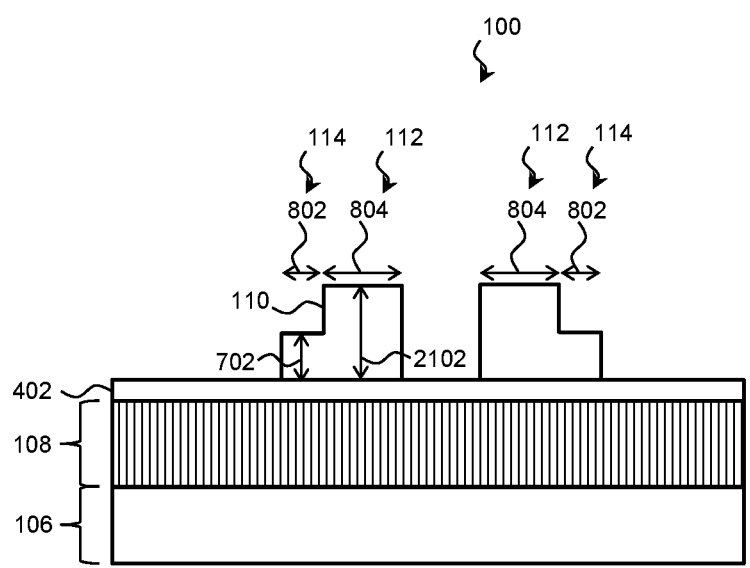

Similar to the masks 100 for positive photoresists, by using the thickness 702 of the absorptive layer 110 in the SRAF 114 region to control the amount of reflected radiation, the SRAF 114 may be made wider than a conventional assist feature, reducing the likelihood of mask defects. In an exemplary embodiment where the width 804 of the printing feature 112 is about 15.5 nm, the width 802 of the SRAF 114 is about 4 nm. It is understood that these dimensions are merely exemplary. The partial-thickness SRAFs 114 also allow for variations in the placement of the SRAFs 114 that are not possible in other configurations. Referring to FIG. 23, in some embodiments, one or more SRAFs 114 are located immediately adjacent to a printing feature 112 so that a single contiguous island of the absorptive layer 110 defines both the printing feature 112 and the one or more SRAFs 114.

Figure 26:
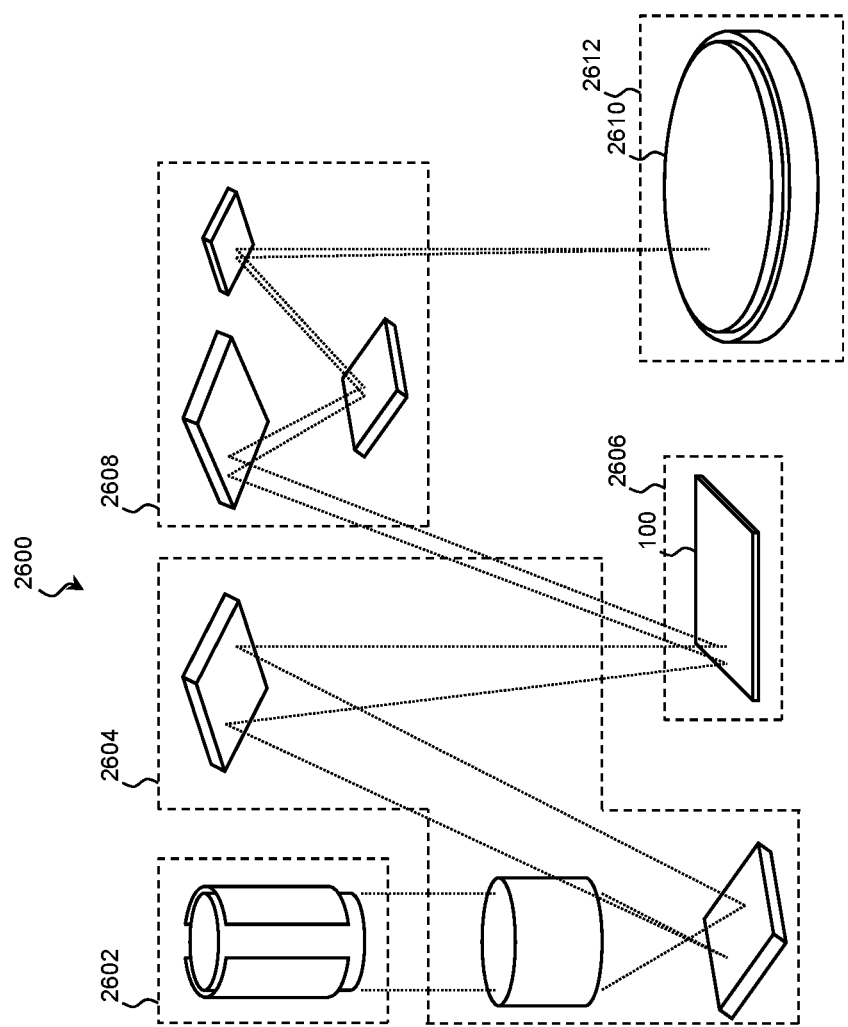
FIG. 26 is a block diagram of a lithography system operable to perform a photolithographic technique according to various aspects of the present disclosure.
Figure 27:
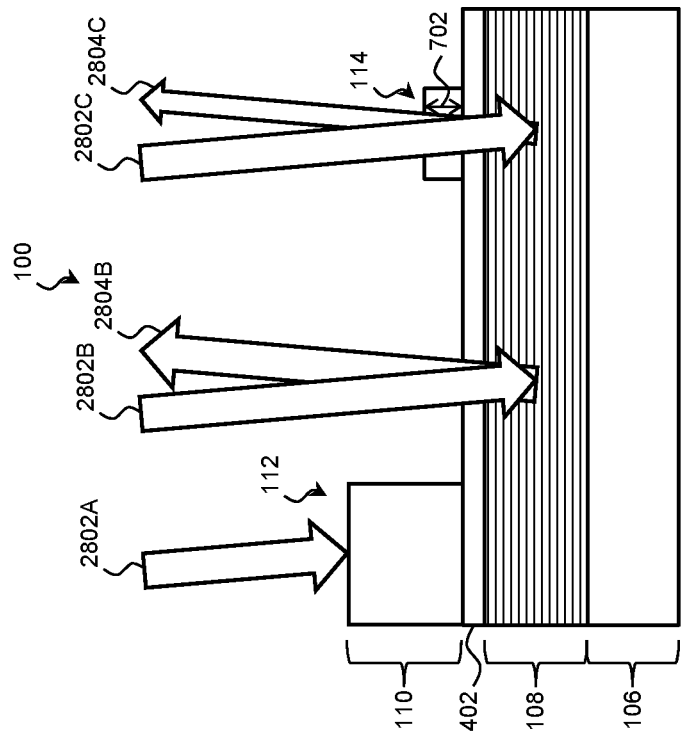
FIGS. 27 and 28 are cross-sectional diagrams of photomasks undergoing a photolithographic technique according to various aspects of the present disclosure.
Figure 28:
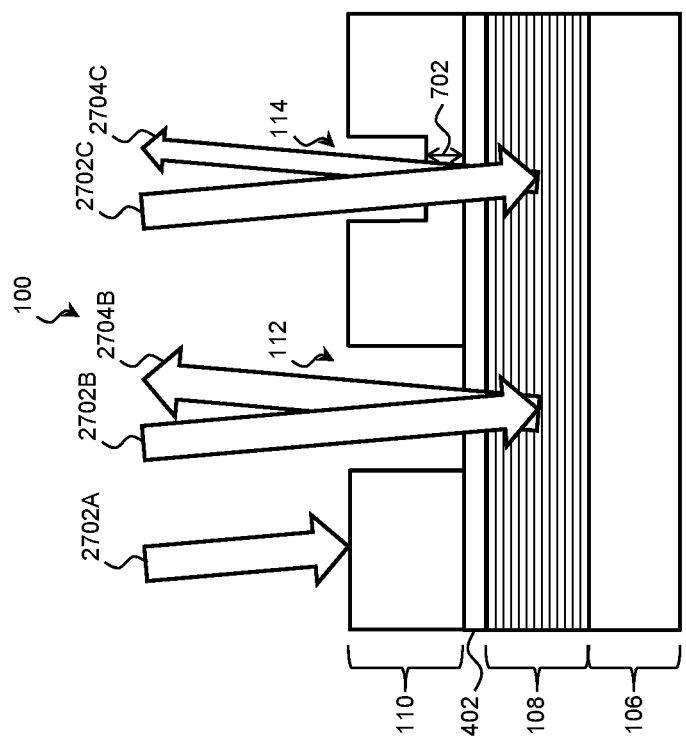

The use of the mask 100 in a photolithographic process will now be described with reference to FIGS. 24-28. FIG. 24 is a flow diagram of a photolithographic technique 2400 according to various aspects of the present disclosure. FIG. 25 is a cross-sectional diagram of a portion of a mask 100 used in the photolithographic technique 2400 according to various aspects of the present disclosure. FIG. 26 is a block diagram of a lithography system 2700 operable to perform the photolithographic technique 2400 according to various aspects of the present disclosure. FIGS. 27 and 28 are cross-sectional diagrams of photomasks undergoing the photolithographic technique 2400 according to various aspects of the present disclosure.

Referring to block 2402 of FIG. 24 and to FIG. 25, a mask 100 is received. In many aspects, the mask 100 may be substantially similar to the masks 100 described above. In that regard, the mask 100 includes a mask substrate 106, a reflector such as a multi-layer mirror (MLM) 108 disposed on the mask substrate 106, a capping layer 402 disposed on the MLM 108, and an absorptive layer 110 disposed on the capping layer 402. The mask 100 includes at least one printing feature 112 region and at least one SRAF 114 region. The SRAF 114 is a partial-thickness assist feature wherein the absorptive layer 110 is only partially removed, which is observable when comparing the thickness 702 of absorptive layer 110 within the SRAF 114 region to the thickness of the absorptive layer 110 within the printing feature region 112. In the illustrated embodiment, all or substantially all of the absorptive layer 100 in the printing feature region 112 is removed, and the absorptive layer 100 in the SRAF 114 region has an intermediate thickness 702 between the thickness of the printing feature region 112 and that of a region that is neither a printing feature 112 region nor an SRAF 114 region. In further embodiments, all or substantially all of the absorptive layer 100 is removed from the region that is neither a printing feature region 112 nor an SRAF region 114, and the absorptive layer 100 in the SRAF 114 region has an intermediate thickness 702 between the thickness of this region and that of the printing feature region 112. The mask 100 may be formed by any suitable technique including those described with respect to FIGS. 3, 10, and 17.

Referring to block 2404 of FIG. 24 and to FIG. 26, the received mask 100 is loaded into a lithography system 2600 and exposed to radiation. The lithography system 2600, which may also be generically referred to as a scanner, is operable to perform a lithographic exposure process utilizing a characteristic radiation source and exposure mode. In the illustrated embodiments, the lithography system 2600 is an extreme ultraviolet (EUV) lithography system designed to expose a workpiece using EUV radiation having a wavelength ranging between about 1 nm and about 100 nm. In some exemplary embodiments, the lithography system 2600 includes a radiation source 2602 that generates EUV radiation with a wavelength centered at about 13.5 nm. In one such embodiment, an EUV radiation source 2602 utilizes laser-produced plasma (LPP) to generate the EUV radiation by heating a medium such as droplets of tin into a high-temperature plasma using a laser.

The lithography system 2600 may also include an illuminator 2604 that focuses and shapes the radiation produced by the radiation source 102. The illuminator 2604 may include refractive optical components, including monolithic lenses and/or array lenses (e.g., zone plates), and may include reflective optical components, including monolithic mirrors and/or mirror arrays. The number of optical components shown FIG. 26 have been reduced for clarity, although in actual embodiments, the illuminator 2604 includes dozens or even hundreds of lenses and/or mirrors. The optical components are arranged and aligned to project radiation emitted by the radiation source 2602 onto the mask 100 retained in a mask stage 2606. The optical components of the illuminator 2604 may also shape the radiation along the light path in order to produce a particular illumination pattern upon the mask 100.

After passing through or reflecting off the mask 100, the radiation is directed through a projection optics module 2608, also referred to as a projection optics box (POB). Similar to the illuminator 2604, the projection optics module 2608 may include refractive optical components, including monolithic lenses and/or array lenses (e.g., zone plates), and may include reflective optical components, including monolithic mirrors and/or mirror arrays. The optical components of the projection optics module 2608 are arranged and aligned to direct radiation transmitted through or reflecting off the mask 100 and to project it onto a workpiece 2610, such as the illustrated semiconductor substrate or any other suitable workpiece, retained in a substrate stage 2612. In addition to guiding the radiation, the optical components of the projection optics module 2608 may also enlarge, narrow, focus, and/or otherwise shape the radiation along the light path.

Referring to block 2406 of FIG. 24, the radiation reflected by the mask 100 is used to expose the workpiece 2610. Radiation projected by the projection optics module 2608 on the workpiece 2610 causes changes in a photosensitive component of the target. In a common example, the workpiece 2610 includes a semiconductor substrate with a photosensitive resist layer. Portions of the photosensitive resist layer that are exposed to the radiation undergo a chemical transition making them either more or less sensitive to a developing process. In an exemplary embodiment, after exposure, the photosensitive resist layer undergoes a post-exposure baking, developing, rinsing, and drying in order to complete the transition. Subsequent processing steps performed on the semiconductor substrate may use the pattern to selectively process portions of the substrate.

Referring to FIG. 27, the exposure of the mask 100 to radiation is shown in more detail. Three incident rays 2702A, 2702B, and 2702C of the radiation are shown. Rays 2702A, 2702B, and 2702C are used to conceptualize the effects of radiation directed towards the photomask 100. As can be seen, rays 2702B and 2702C are reflected by the MLM 108 to form reflected rays 2704B and 2704C, respectively. Because ray 2702A, which impacts an area of the mask 100 that does not correspond to either a printing feature 112 or an SRAF 114, is blocked by the absorptive layer 110, no reflected ray is shown. In contrast, ray 2702B impacts a printing feature 112 region where all or substantially all of the absorptive layer 110 has been removed. Accordingly, reflected ray 2704B may have substantially the same intensity as the incident ray 2702B (ignoring any loss due to the MLM 108). Finally, ray 2702C impacts an SRAF 114 region where the absorptive layer 110 has an intermediate thickness greater than that of the printing feature 112 region but less than that of the regions that are neither printing feature 112 regions nor SRAF 114 regions. Accordingly, some but not all of ray 2702C is blocked by the absorptive layer 110, and reflected ray 2704C has a lower intensity than reflected ray 2704B but a greater intensity than any reflection created by ray 2702A.

While the mask 100 of FIG. 27 is suitable for exposing a positive photoresist of the workpiece 2610, referring to FIG. 28, a mask 100 suitable for exposing a negative photoresist of the workpiece 2610 is shown. Here as well, three incident rays 2802A, 2802B, and 2802C of the radiation are shown. Rays 2802B and 2802C are reflected by the MLM 108 to form reflected rays 2804B and 2804C, respectively. Because ray 2802A, which impacts a printing feature 112 region of the mask 100, is blocked by the absorptive layer 110, no reflected ray is shown. Ray 2802B impacts a region that is neither a printing feature 112 region nor an SRAF 114 region and where all or substantially all of the absorptive layer 110 has been removed. Accordingly, reflected ray 2804B may have substantially the same intensity as the incident ray 2802B (ignoring any loss due to the MLM 108). Ray 2802C impacts an SRAF 114 region where the absorptive layer 110 has an intermediate thickness less than that of the printing feature 112 region but greater than that of the regions that are neither printing feature 112 regions nor SRAF 114 regions. Accordingly, some but not all of ray 2802C is blocked by the absorptive layer 110, and reflected ray 2804C has a lower intensity than reflected ray 2804B but a greater intensity than any reflection created by ray 2802A.

In the embodiments of FIGS. 27 and 28, the thickness 702 (as well as the width) of absorptive layer 110 in the SRAF 114 region is used to control the intensity of the radiation reflected by this region (shown by rays 2704C and 2804C, respectively). To avoid printing of the SRAF 114, the intensity of the radiation reflected by the SRAF 114 region is controlled to be less than an exposure threshold of the photoresist formed on the workpiece 2610. By controlling this intensity using absorber thickness 702, effects such as line-width roughness, fill-in particle defects, absorptive layer collapse, and other defects associated with extremely narrow SRAF 114 features may be avoided.

The present disclosure presents multiple embodiments and multiple advantages. It is understood that the attribution of an advantage to an embodiment is merely for clarity and understanding. Different embodiments can offer different advantages, and no particular advantage is required for any one embodiment.

Thus, the present disclosure provides a reflective photolithography mask with improved sub-resolution assist features and a method for forming the mask. In some exemplary embodiment, the lithographic mask comprises a mask substrate, a reflective structure disposed on the mask substrate, and an absorptive layer formed on the reflective structure. The mask includes a printing feature region and an assist feature region. The absorptive layer has a first thickness in the printing feature region and a second thickness, different from the first thickness, in the assist feature region. In some such embodiments, the second thickness is configured so that radiation reflected by the assist feature region does not exceed an exposure threshold of a photoresist of a target. In some embodiments, the absorptive layer includes an upper absorptive layer and a lower absorptive layer that is different from the upper absorptive layer. In one such embodiment, the assist feature region includes a portion of the upper absorptive layer and a portion of the lower absorptive layer. In a further such embodiment, the assist feature region is substantially free of the upper absorptive layer.

In further exemplary embodiments, the reflective lithographic mask comprises a reflective structure; an absorptive structure formed on the reflective structure; a printing feature; and an assist feature. An interface is defined between the reflective structure and the absorptive structure. A thickness of the absorptive structure within the printing feature measured perpendicular to the interface is different from a thickness of the absorptive structure within the assist feature measured perpendicular to the interface. In some such embodiments, the assist feature is adjacent to the printing feature. In some such embodiments, the thickness of the absorptive structure within the assist feature is configured such that radiation reflected by the assist feature does not exceed an exposure threshold of a photoresist of a target.

In further exemplary embodiments, the photolithographic technique comprises receiving a mask having a printing feature region, a sub-resolution assist feature (SRAF) region, and a third region that is neither a printing feature region nor an SRAF region. Each region has a different thickness of an absorptive layer disposed therein. The mask is exposed to radiation such that an intensity of radiation reflected by the SRAF region is substantially between an intensity of radiation reflected by the printing feature region and an intensity of radiation reflected by the third region. The radiation reflected by the printing feature region, the radiation reflected by the SRAF region, and the radiation reflected by the third region is used to expose a workpiece. In some such embodiments, the intensity of the radiation reflected by the SRAF region is maintained not to exceed an exposure threshold of a photoresist of the workpiece.

In yet further embodiments, the method for manufacturing a photomask includes: receiving a mask including a substrate, a radiation-absorptive structure formed on the substrate, and a resist formed on the radiation-absorptive structure; patterning the resist to define a printing feature and an assist feature; etching the radiation-absorptive structure to form the printing feature and the assist feature such that a first thickness of the radiation-absorptive structure within the printing feature is different from a second thickness of the radiation-absorptive structure within the assist feature; and thereafter removing the resist. In some such embodiments, the etching of the radiation-absorptive structure includes an etching technique having a width-dependent etching rate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photolithographic technique, the technique comprising:
receiving a mask substrate having an absorptive layer and including a printing feature region and an assist feature region defined thereupon, wherein the absorptive layer has a first thickness in the printing feature region and a second, different, thickness in the assist feature region, and
exposing the mask to radiation, such that an intensity of radiation reflected by the assist feature region is substantially different from an intensity of radiation reflected by the printing feature region; and
using the radiation from the printing feature region and the radiation from assist feature region to expose a workpiece.

2. The photolithographic technique of claim 1, wherein the printing feature region is substantially free of the absorptive layer.

3. The photolithographic technique of claim 1, wherein the first thickness is greater than the second thickness.

4. The photolithographic technique of claim 1, wherein the second thickness is configured such that radiation from the assist feature region does not exceed an exposure threshold of a photoresist of a target.

5. The photolithographic technique of claim 1, further comprising maintaining the intensity of the radiation from the assist feature region is maintained not to exceed an exposure threshold of a photoresist of the workpiece.

6. The photolithographic technique of claim 1, wherein the absorptive layer includes an upper absorptive layer and a lower absorptive layer.

7. The photolithographic technique of claim 6, wherein the assist feature region includes a portion of the upper absorptive layer and a portion of the lower absorptive layer.

8. The photolithographic technique of claim 6, wherein the assist feature region is substantially free of the upper absorptive layer.

9. A photolithographic technique, the technique comprising:
receiving a mask having a printing feature region, a sub-resolution assist feature (SRAF) region, and a third region that is neither a printing feature region nor an SRAF region, each region having a different thickness of an absorptive layer disposed therein;
exposing the mask to radiation, such that an intensity of radiation reflected by the SRAF region is substantially between an intensity of radiation reflected by the printing feature region and an intensity of radiation reflected by the third region; and
using the radiation reflected by the printing feature region, the radiation reflected by the SRAF region, and the radiation reflected by the third region to expose a workpiece.

10. The photolithographic technique of claim 9, wherein the intensity of the radiation reflected by the SRAF region is maintained not to exceed an exposure threshold of a photoresist of the workpiece.

11. The photolithographic technique of claim 9, wherein the thickness of the absorptive layer disposed in the printing feature region is less than the thickness of the absorptive layer disposed in the SRAF region.

12. The photolithographic technique of claim 11, wherein the intensity of the radiation reflected by the SRAF region is less than the intensity of the radiation reflected by the printing feature region.

13. The photolithographic technique of claim 9, wherein the thickness of the absorptive layer disposed in the printing feature region is greater than the thickness of the absorptive layer disposed in the SRAF region.

14. The photolithographic technique of claim 12, wherein the intensity of the radiation reflected by the SRAF region is greater than the intensity of the radiation reflected by the printing feature region.

15. The photolithographic technique of claim 9, wherein the exposing of the mask uses extreme-ultraviolet (EUV) radiation.

16. The photolithographic technique of claim 9, wherein the received mask is configured to expose a negative photoresist of the workpiece.

17. A photolithographic technique, the technique comprising:
receiving a mask having a printing feature region and a second region, each region having a different thickness of an absorptive layer disposed therein;
exposing the mask to radiation, such that an intensity of radiation reflected by the printing feature region is substantially different from an intensity of radiation reflected by the second region; and
using the radiation reflected by the printing feature region and the radiation reflected by the second region to expose a workpiece.

18. The photolithographic technique of claim 17, wherein the mask further includes an assistive feature region having a different thickness of the absorptive layer than either the printing feature region or the second region,
wherein the intensity of the radiation reflected by the assistive feature region is maintained not to exceed an exposure threshold of a photoresist of the workpiece.

19. The photolithographic technique of claim 18, wherein the thickness of the absorptive layer disposed in the printing feature region is less than the thickness of the absorptive layer disposed in the assistive feature region.

20. The photolithographic technique of claim 18, wherein the thickness of the absorptive layer disposed in the printing feature region is greater than the thickness of the absorptive layer disposed in the SRAF region.

* * * * *